US007068498B2

(12) United States Patent
Bolich et al.

(10) Patent No.: US 7,068,498 B2
(45) Date of Patent: Jun. 27, 2006

(54) COMPUTER SYSTEM WITH SLIDABLE MOTHERBOARD

(75) Inventors: Bryan D. Bolich, Davis, CA (US); Kenneth G. Robertson, San Jose, CA (US); Robert S. Jetter, Dublin, CA (US); Bradley D. Blackwood, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/442,036

(22) Filed: May 20, 2003

(65) Prior Publication Data

US 2004/0233643 A1 Nov. 25, 2004

(51) Int. Cl.
*H05K 5/00* (2006.01)
*H05K 7/00* (2006.01)
(52) U.S. Cl. .................. 361/683; 361/790; 361/752; 361/801
(58) Field of Classification Search ........ 361/683–686, 361/800, 752, 801, 788, 740–741, 796–797, 361/747–748, 724–732, 756, 759, 798, 802, 361/807
See application file for complete search history.

(56) References Cited

U.S. PATENT DOCUMENTS

| | | | | |
|---|---|---|---|---|
| 5,460,441 | A | * | 10/1995 | Hastings et al. ............ 312/298 |
| 5,949,645 | A | * | 9/1999 | Aziz et al. .................. 361/695 |
| 6,115,258 | A | | 9/2000 | Hoyle, Jr. et al. |
| 6,261,104 | B1 | * | 7/2001 | Leman ........................ 439/61 |
| 6,304,456 | B1 | | 10/2001 | Wortman |
| 6,305,556 | B1 | | 10/2001 | Mayer |
| 6,335,868 | B1 | | 1/2002 | Butterbaugh et al. |
| 6,477,055 | B1 | * | 11/2002 | Bolognia et al. ........... 361/724 |
| 6,560,114 | B1 | * | 5/2003 | Berry et al. ................. 361/727 |

OTHER PUBLICATIONS

IW-Q2000 ATX Full Tower Chassis, User's Manual, Version 1.0, IN WIN Development Inc., date unknown, 12 pages.
IW-Q500 ATX Full Tower Chassis, User's Manual, Version 1.0, IN WIN Development Inc., date unknown, 12 pages.
InWin Q500 ATX Full Tower Case, http://www.pcstats.com/articleview.cfm?articleid=570&page=1, copyright 2003 PCstats.com, printed May 2, 2003, 4 pages.
InWin Q500 ATX Full Tower Case, http://www.pcstats.com/articleview.cfm?articleid+570&page=2, copyright 2003 PCstats.com, printed May 2, 2003, 3 pages.

\* cited by examiner

*Primary Examiner*—Kammie Cuneo
*Assistant Examiner*—Hung S. Bui

(57) ABSTRACT

A computer system includes a chassis and a motherboard support system including a motherboard carrying at least one daughter card and slidably supported within the chassis. In one embodiment, the motherboard has a first connector and the system further includes a printed circuit board having a second connector, wherein the motherboard support system slides between a first position in which the connectors are connected and a second position in which the connectors are disconnected. In another embodiment, the system includes a component mounted to the chassis, wherein the motherboard support system is slidably supported within a plane between the component and the chassis. In one embodiment, an actuator is provided to slide the motherboard support system.

55 Claims, 9 Drawing Sheets

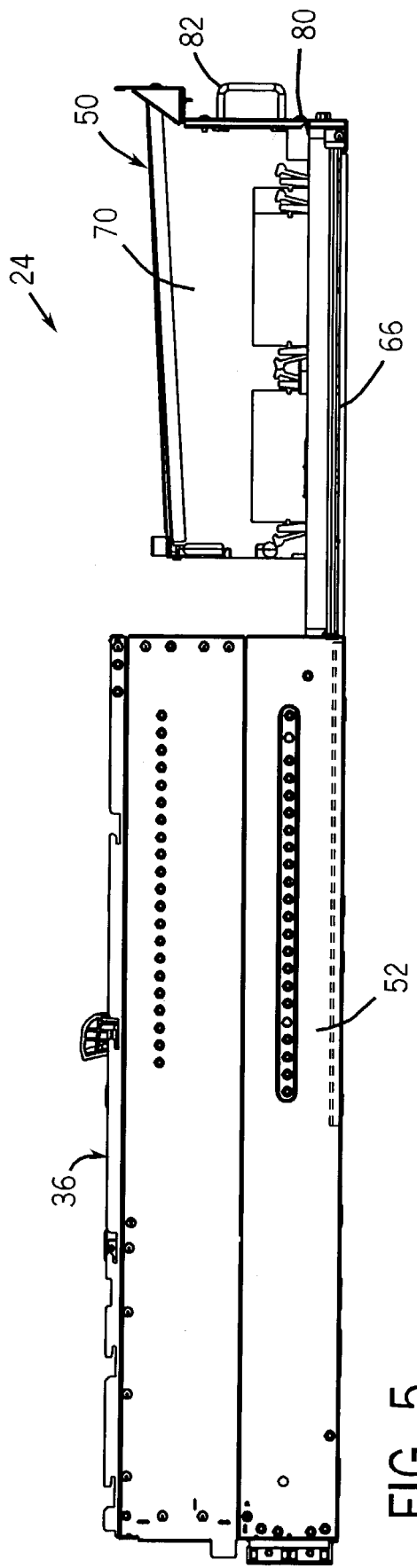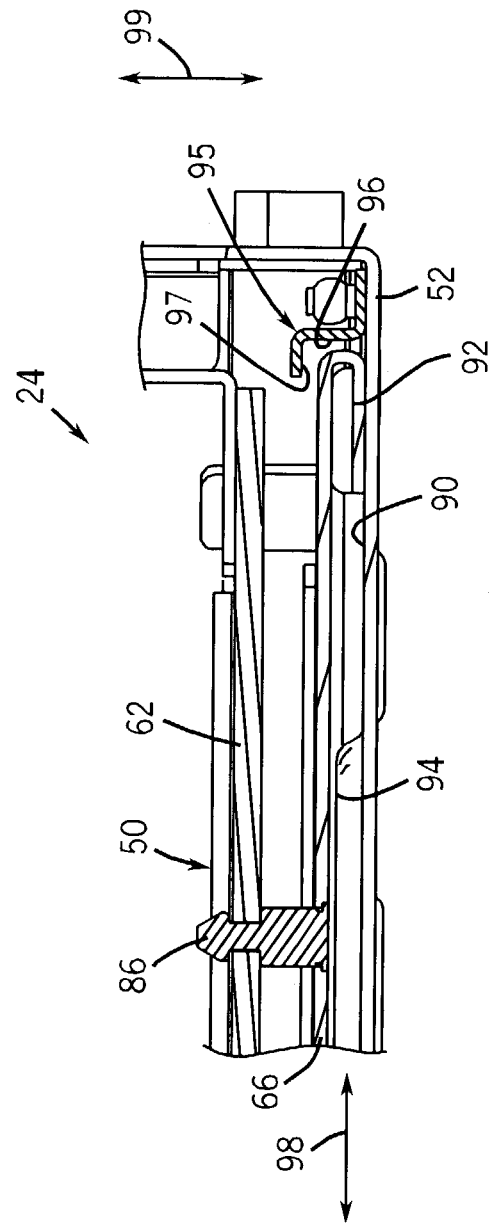

COMPUTER SYSTEM WITH SLIDABLE MOTHERBOARD

BACKGROUND OF THE INVENTION

Computer systems typically include a chassis, a multitude of different internal components such as memory units, processor units, power systems, a cooling system, various input/output PCI cards, and a motherboard. The motherboard functions similar to that of a highway by facilitating communication between each of the internal components of the system. The motherboard includes connector slots facilitating connection to other printed circuit boards or cards. The motherboard is typically permanently attached to the chassis and is also connected to other internal components via cables or internal connectors. In many systems, the motherboard generally extends in a plane between the chassis and the remaining internal components of the system. To remove the motherboard for servicing generally requires that the top casing or cover of the chassis be removed and that those internal components extending above the motherboard also be removed. Removal of the motherboard for servicing further requires that tools be used to disconnect the fasteners affixing the motherboard to the chassis. After all of this is completed, the motherboard is then lifted out of the chassis for servicing.

SUMMARY OF THE INVENTION

According to one aspect of the present invention, a computer system includes a chassis, a component mounted to the chassis, at least one daughter card and a motherboard support system including a first printed circuit board supporting the at least one daughter card. The motherboard support system is slidably supported between the chassis and the component. The motherboard support system is slidable between a first position in which the motherboard support system is substantially received within the chassis and a second position in which the motherboard support system is at least partially removed from the chassis.

According to another aspect of the present invention, a method for assembling and disassembling a computer system including a chassis, a first printed circuit board having at least one first connector and supporting at least one second printed circuit board connected to the first printed circuit board and a third printed circuit board having at least one second connector is disclosed. The method includes the steps of sliding the first printed circuit board relative to the chassis between a first position in which the at least one first connector engages the at least one second connector and a second position in which the first printed circuit board is at least partially removed from the chassis.

According to another aspect of the present invention, a support system for a computer system having a motherboard having at least one slot configured to receive at least one printed circuit board is provided. The support system includes a chassis and an actuator coupled to the chassis. The actuator is configured to engage the motherboard to move the motherboard towards at least one of a first position in which the motherboard is completely received within the chassis and a second position in which the motherboard is at least partially removed from the chassis.

According to another aspect of the present invention, a motherboard support system for use with a computer system including a support system having a chassis and a lever pivotally supported by the chassis is disclosed. The motherboard support system includes at least one daughter card, a motherboard supporting the at least one daughter card and a catch surface coupled to the motherboard. The catch surface is adapted to engage the lever during rotation of the lever such that the motherboard is urged towards at least one of a first position in which the motherboard is completely received within the chassis and a second position in which the motherboard is at least partially removed from the chassis.

According to another aspect of the present invention, a computer system includes a chassis, a motherboard support system including a first printed circuit board having a first connector, a second printed circuit board having a second connector, and an actuator. The motherboard support system is solidly supported by the chassis for movement between a first position in which the first connector is connected to the second connector and a second position in which the first connector and the second connector are disconnected. The actuator is proximate the motherboard support system and is configured to move the motherboard support system between the first position and the second position.

According to yet another aspect of the present invention, a computer system includes a chassis, a first printed circuit assembly having at least one slot adapted to facilitate connection of a daughter card and a first connector, and a second printed circuit assembly having a second connector. The system further includes means for slidably supporting the first printed circuit assembly within the chassis for movement between a first position in which the first connector and the second connector are connected and a second position in which the first connector and the second connector are disconnected.

BRIEF DESCRIPTION OF THE DRAWINGS

FIG. 5 is a right side elevational view of the computer system shown in FIG. 4.

FIG. 6 is a fragmentary enlarged sectional view of the computer system of FIG. 2 taken along line 6—6.

DETAILED DESCRIPTION OF THE PREFERRED EMBODIMENTS

Figure 1:
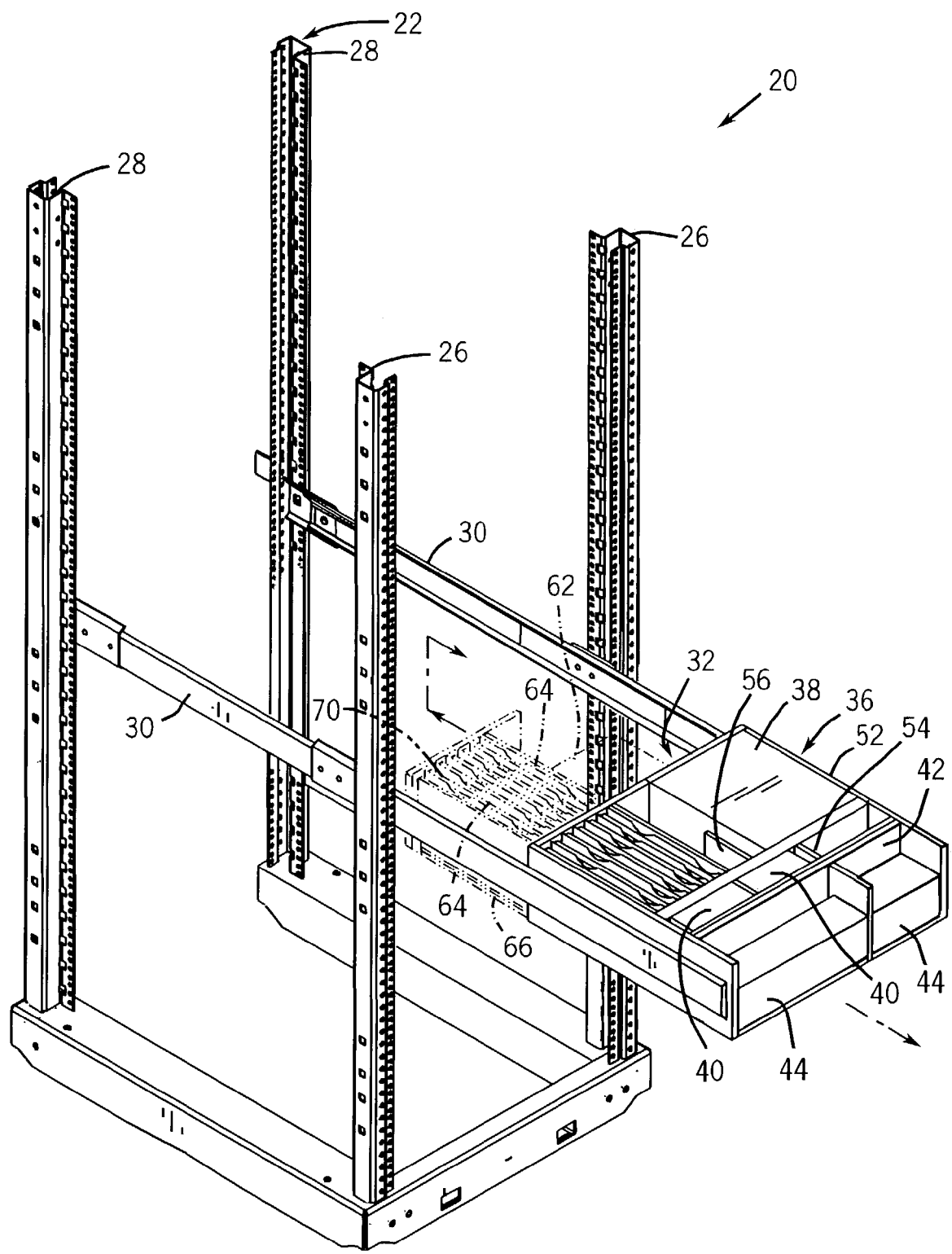
FIG. 1 is a perspective view of a multi-computer support system including a vertical support unit supporting an individual computer system having a chassis and a motherboard support system within the chassis and at least partially out of the chassis as shown in phantom.

FIG. 1 is a perspective view of a multi-computer support system 20 generally including a vertical support unit 22 and an individual computer system 24. Vertical support unit 22 is configured to support a plurality of individual computer systems 24 in a vertical and stacked arrangement. For ease of illustration, only a single computer system 24 is shown being supported by the vertical support unit 22. In the embodiments shown, vertical support unit 22 is illustrated as a rack having front columns 26 and rear columns 28 supporting an opposite pair of slides 30. For ease of illustration, many elements or members of rack 22 are omitted such as side panels, and additional slides.

Slides 30 slidably support computer system 24 relative to posts or columns 26 and 28 for movement between an inset position in which computer system 24 is substantially located within the rectangular volume defined by the four columns 26, 28, and an extended position in which computer system 24 is extended forwardly beyond front columns 26. In the particular embodiment shown, slides 30 support computer system 24 such that a rear end 32 of computer system 24 extends approximately 8 to 10 inches forward of front columns 26. Although less desirable, slides 30 may alternatively be configured to slidably support computer system 24 for movement beyond front columns 26 to a lesser extent. One example of a pair of slides is described in U.S. Pat. No. 6,305,556 entitled CABLE MANAGEMENT SOLUTION FOR RACK-MOUNTED COMPUTERS, the full disclosure of which is hereby incorporated by reference.

Computer system 24 (schematically shown) is supported by slides 30 and generally includes an overall unit support system 36, various internal hardware components including a power system 38 and a plurality of fans 40, a vertical backplane 42, various auxiliary computer units 44 and motherboard support system 50. Overall unit support system 36 generally comprises one or more structures configured to at least substantially enclose and support each of the internal components 38–50. In particular, system 36 includes a chassis 52, internal support structures, such as support structures 54, coupled to chassis 52 and configured to support or guide the internal components, a top cover (not shown) and an optional front bevel (not shown).

As will be described in greater detail hereafter, support system 36 additionally includes an actuator 56 schematically shown in FIG. 1. Actuator 56 is generally coupled to chassis 52. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. In one embodiment, the actuator 56 may be coupled directly to chassis 52, while in another embodiment, the actuator may be coupled to an intermediate support structure 54 or a housing of an internal component. Actuator 56 is configured to engage motherboard support system 50 so as to move the motherboard support system 50 relative to chassis 52. In particular, actuator 56 is configured to move motherboard support system 50 between a first position in which the motherboard is completely received within the chassis and a second position in which the motherboard support system 50 is at least partially removed from chassis 52. In one embodiment, the actuator 56 may comprise an electrical, hydraulic, or pneumatic powered actuator. An example of an electric actuator would be an electric solenoid. In still other embodiments, actuator 56 may comprise a mechanical actuator such as a lever.

Power system 38 generally comprises a conventionally known power system configured to supply electrical power to the remaining internal components of system 24. In the embodiment shown, power system 38 is coupled to chassis 52 at a location spaced from a floor of chassis 52. Fans 40 comprise conventionally known or future developed fans configured to blow air at least partially through chassis 52 to cool the remaining internal components of system 24. In the particular embodiment shown, fans 40 are coupled to chassis 52 at a location spaced from the floor of chassis 52.

Vertical backplane 42 generally comprises a printed circuit board having at least one connector 60 (shown in FIG. 7) configured for a connection with motherboard support system 50. In the particular embodiment shown, vertical backplane 40 is located generally within chassis 52 between motherboard support system 50 and auxiliary components 44. Vertical backplane 42 is connected to auxiliary components 44 and generally serves as an auxiliary motherboard for such components. For purposes of this disclosure, a backplane generally consists of a circuit board containing sockets into which other circuit boards can be plugged. The term "backplane" is also synonymous with the term "motherboard."

Auxiliary computing components 44 may comprise a variety of conventionally known or future developed units such as displays, CD/DVDs, and memory units. Memory units may be in the form of a plurality of memory cards or a hard disk drive. Such auxiliary units are generally plugged directly into backplane 42 or are connected to backplane 42 via cabling.

Motherboard support system 50 is slidably received within chassis 52 for movement between a first position in which motherboard support system 50 is within chassis 52 and a second position in which motherboard support system 50 is at least partially, and-preferably completely, removed from chassis 52. Motherboard support system 50 generally includes a motherboard 62, at least one daughter card 64 connected to and supported by motherboard 62, and a support 66 coupled to motherboard 62. Motherboard 62 includes a plurality of slots or sockets into which daughter cards 64 are connectedly received. Support 66 generally comprises a stiffening member coupled to motherboard 62 and support motherboard 62. In the embodiment shown, support 66 further assists in slidably supporting motherboard 62 relative to chassis 52. Although less desirable, motherboard support system 50 may omit support 66.

Motherboard 62 additionally includes at least one connector 68 (shown in FIG. 7) configured to connect with connector 60 of vertical backplane 40. In the embodiment shown, motherboard support system 50 slides between a connected position in which connector 68 is connected to connector 60 and a disconnected position in which connectors 68 and 60 are disconnected.

Overall, computer system 24 facilitates assembling and disassembling of computer system 24 for repair or replacement of one or more components supported by motherboard support system 50. As shown by FIG. 1, motherboard support system 50 may be slid relative to chassis 52 in a rearward direction to disconnect connector 68 of motherboard 62 from connector 60 of vertical backplane 42. Motherboard support system 50 may be further slid in a rearward direction to at least partially remove or withdraw circuit board 62 and daughter card 64 from chassis 52 for improved access to motherboard 62, daughter card 64, or other components connected to motherboard 62. Should the entire motherboard 62 need to be worked on or replaced, system 24 facilitates complete removal of motherboard support system 50 by sliding motherboard support system 50 rearward relative to chassis 52. Prior to complete removal of motherboard support system 50, any cabling connections to motherboard 62 should be disconnected.

As further shown by FIG. 1, computer system 24 facilitates repair or replacement of motherboard support system 50 while chassis 52 remains coupled to vertical support unit 22. In particular, should a problem arise with one or more components of motherboard support system 50, computer system 24 may be slid forward to a position in front of front columns 26 while still being supported by slides 30. If so equipped, actuator 56 may then be actuated to move motherboard support system 50 in a rearward direction to disconnect connectors 68 and 60. If so configured, actuator 56 may further urge motherboard support system 50 to a position in which motherboard support system 50 is at least partially removed from chassis 52. Thereafter, a person may simply grasp the rear end 32 of motherboard support system 50 to withdraw motherboard support system 50 from chassis 52 and to carry motherboard support system 52 over or beneath chassis 52 and out of vertical support unit 22 for repair or inspection upon a workbench or other surface. As a result, removal and repair or replacement of motherboard support system 50 is achieved without requiring complete removal of chassis 52 from vertical support unit 22, without requiring the internal components of computer system 24, such as power system 38 and the like, to be removed from chassis 52 and without requiring many, if any, tools.

Figure 2:
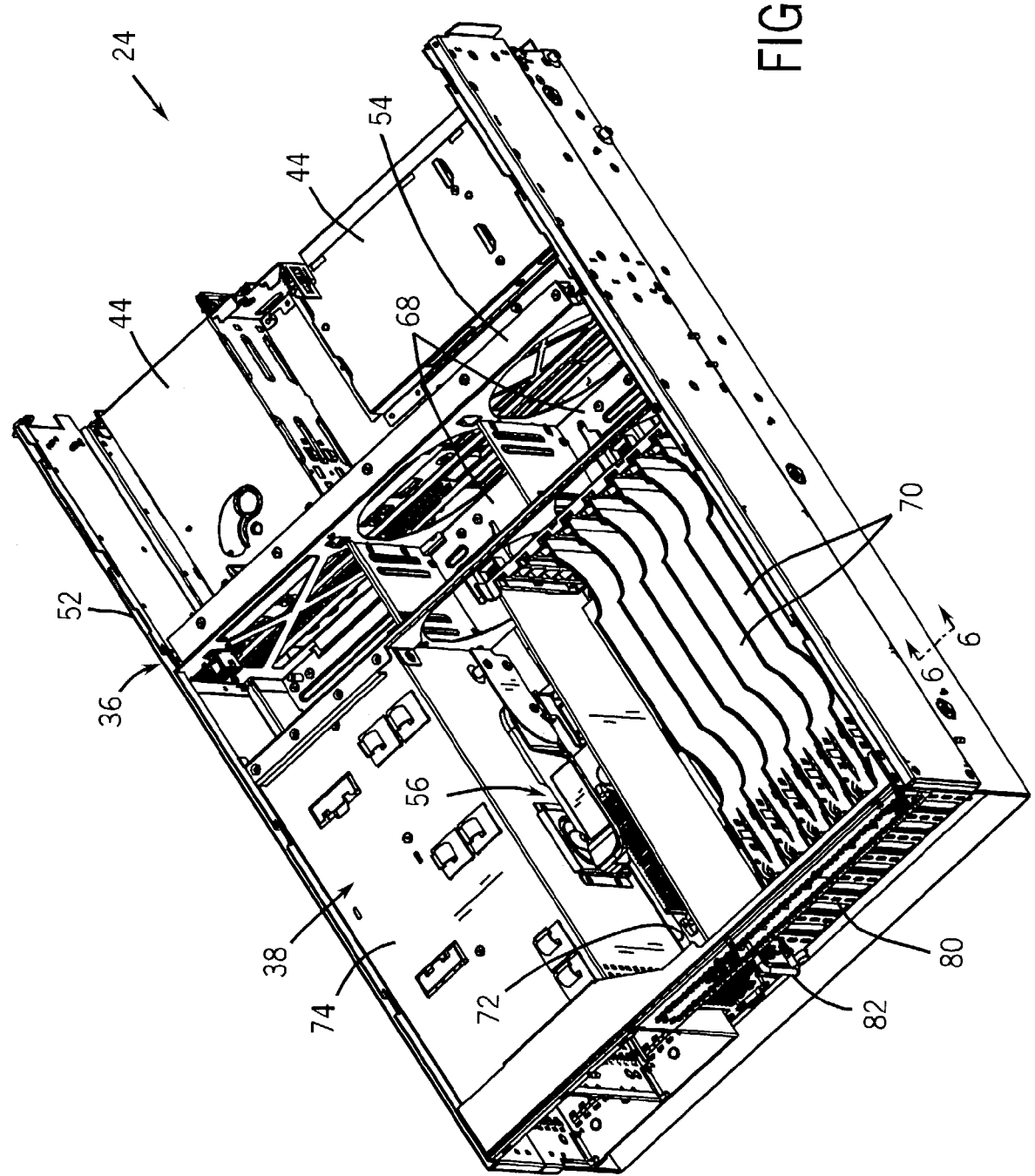
FIG. 2 is a top rear perspective view of a specific embodiment of the computer system shown in FIG. 1 illustrating the motherboard support system within the chassis.
Figure 3:
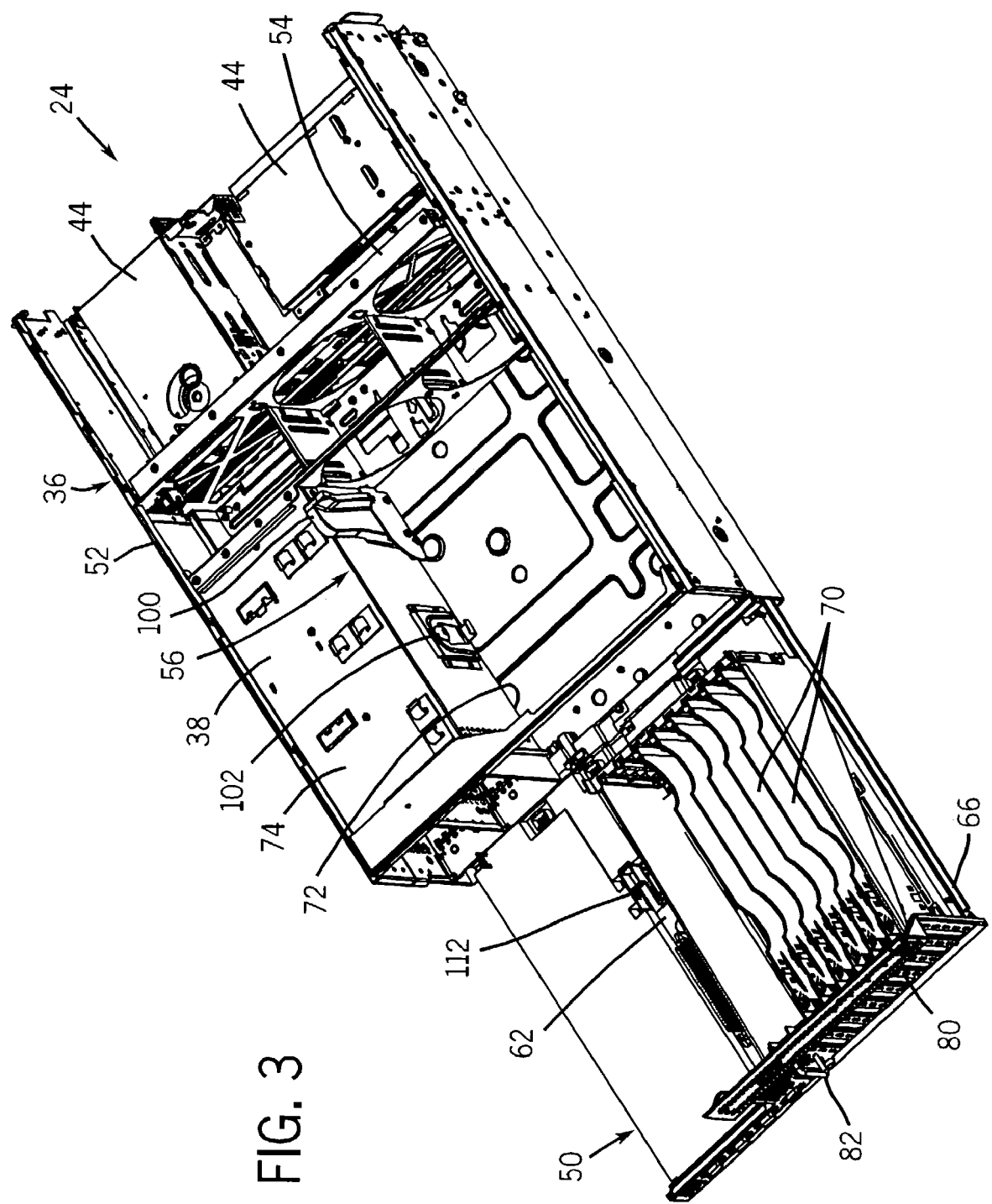
FIG. 3 is a top rear perspective view of the computer system of FIG. 2 illustrating the motherboard support system partially withdrawn from the chassis.

FIGS. 2–13 illustrate one embodiment of computer system 24 in greater detail. For ease of illustration, fans 40 (shown in FIG. 1) are omitted from cavities 68, daughter cards 64 (shown in FIG. 1) are removed from the slot connectors of motherboard 62 and withdrawn from between card dividers 70, and interior hardware of power system 38 is omitted. As illustrated by FIGS. 2 and 3, motherboard support system 50 is slidably supported within chassis 52 for movement between a first position (shown in FIG. 2) in which motherboard support system 50 is substantially received within chassis 52 and a second position (shown in FIG. 3) in which motherboard support system 50 is at least partially removed from chassis 52. In the particular embodiment illustrated, computer system 24 is configured such that motherboard support system 50 may be completely removed from chassis 52 after disconnection of any cables connected to motherboard 62. In the particular embodiment illustrated, motherboard support system 50 is slidably supported within chassis 52 in a plane extending between chassis 52 and an opposite surface 72 of the casing or housing 74 of power system 38. Motherboard support system 50 is further slidably supported within chassis 52 in a plane extending between fans 40 (shown in FIG. 1) and chassis 52. When motherboard support system 50 is completely positioned within chassis 52, motherboard 62 extends between surface 72 of power system 38 and chassis 52 and between fans 40 and chassis 52. As a result, this architecture preserves valuable interior space within chassis 52.

Figure 4:
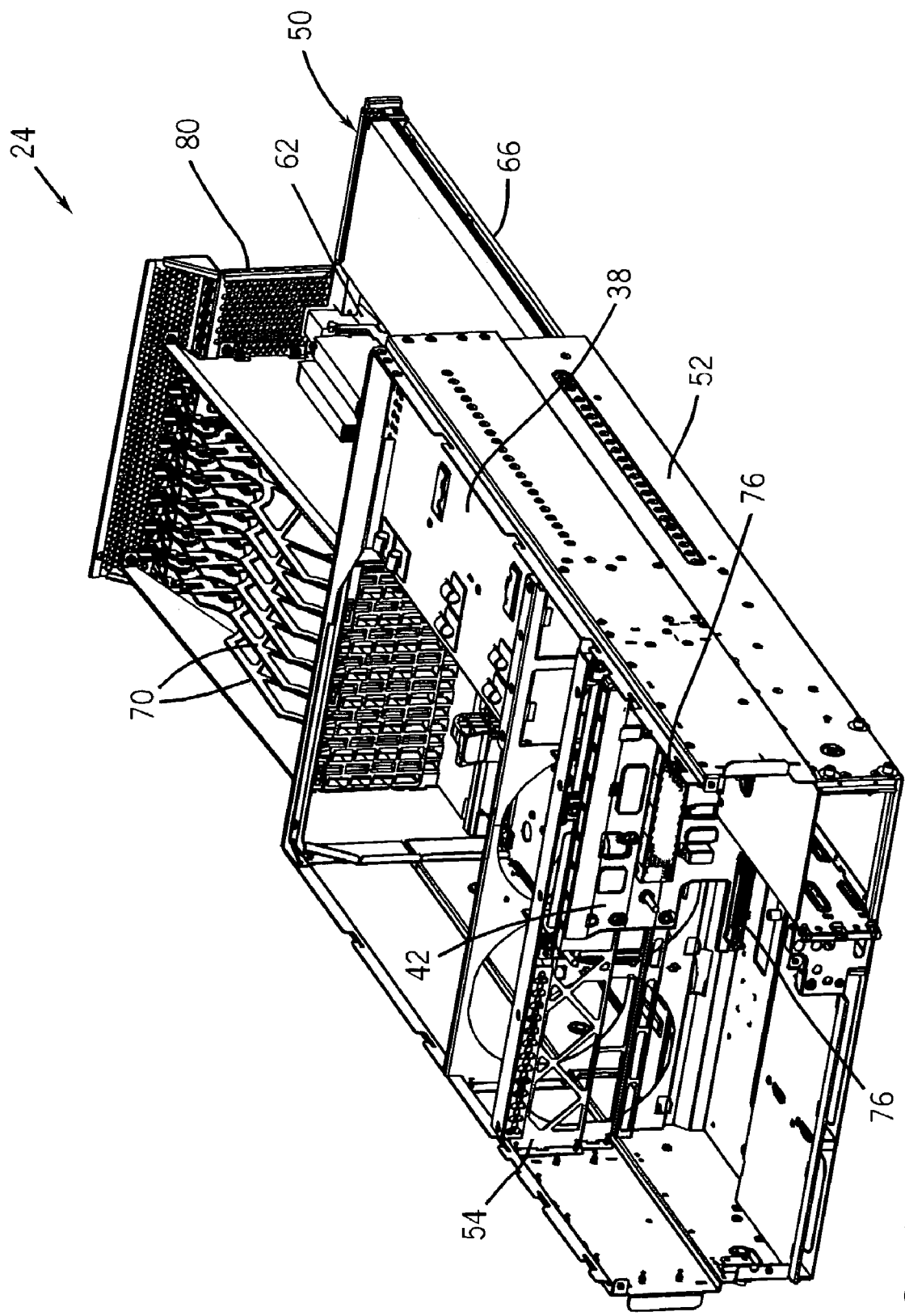
FIG. 4 is a top front perspective view of the computer system shown in FIG. 3.
Figure 7:
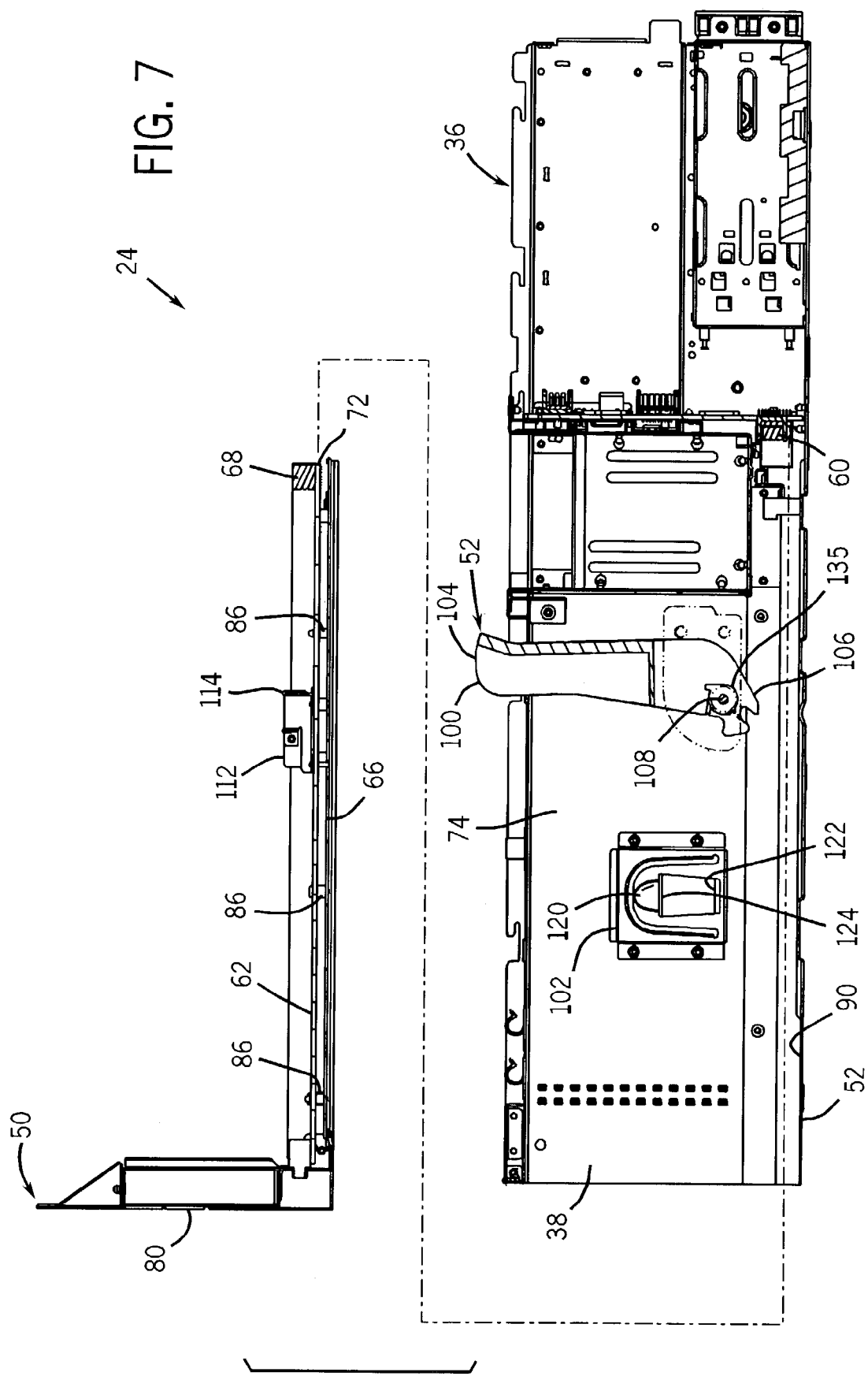
FIG. 7 is an exploded sectional view of the computer system of FIG. 3 illustrating removal of the motherboard support system from the chassis illustrating one embodiment of an actuator comprising a lever in a disconnecting state.

FIG. 4 is a perspective view illustrating a front end of computer system 24 with motherboard support system 50 at least partially removed from chassis 52. For ease of illustration, FIG. 4 omits auxiliary components 44 (shown in FIG. 1) as well as a front panel and an optional bezel which are normally provided. As shown by FIG. 4, vertical backplane 42 is coupled to chassis 52 by means of an intermediate support structure 54. Vertical backplane 42 includes a plurality of forwardly facing connectors 76 which are configured to mate or connect with either cable connectors or connectors from auxiliary components 44 (shown in FIG. 1). As best shown by FIG. 7, vertical backplane 42 includes connector 60 which extends below support structure 54 and which faces connector 68 of motherboard support system 50 in the plane that extends between chassis 52 and power system 38 as well as fans 40.

As best shown by FIG. 5, motherboard support system 50 includes a rear panel 80 and handle 82. Panel 80 generally extends perpendicular to support 66 and is coupled to support 66 so as to seal off an end of enclosure 52. Panel 80 includes a multitude of openings and perforations to enable exterior access to the bulkheads of daughter cards 64 when daughter cards 64 are connected to motherboard 62 and to also facilitate air flow out of chassis 52.

Handle 82 is coupled to panel 80 and is generally configured to enable an individual to grasp motherboard support system 50 so as to slide motherboard support system 50 into or out of chassis 52. Although less desirable, handle 82 may be omitted or may have other configurations.

FIGS. 6 and 7 illustrate motherboard 62 and support 66 in greater detail. As best shown by FIG. 7, support 66 generally comprises an elongate tray extending below motherboard 62 secured to motherboard 62 by standoffs 86 which space motherboard 62 from support 66. Connector 68 is coupled to motherboard 62 proximate to a perimeter edge 88 of motherboard 62 to facilitate connection with connector 60. In the particular embodiment shown, connectors 60 and 68 comprise high density pin connectors. In one embodiment, connector 60 includes pins which project past edge 88 and over motherboard 62 when connector 68 is connected to connector 60. In one embodiment, connectors 68 and 60 comprise HS3 type connectors sold by AMP. In an alternative embodiment, connector 68 has a plurality of pins which project beyond edge 88 of motherboard 62. Connectors 68 and 60 connect to one another along a plane generally parallel to or co-extensive with motherboard 62.

As further shown by FIG. 7, motherboard support system 50 and chassis 52 are configured to facilitate slidable movement of motherboard support system 50 within chassis 52. In particular, motherboard 62 is slidably supported relative to chassis 52 so as to slide within chassis 52 between a perimeter of power system 38 and floor 90 of chassis 52. For purposes of this disclosure, any terms pertaining to horizontal or vertical directions such as "up," "down," "above," "below," "horizontal," "vertical" and the like are solely used for the purpose of describing relative positions of various components or elements as illustrated in the present figures. The use of such horizontal and vertical terms is not intended to limit the orientation in which chassis 52 or the components of computer system 24 are supported relative to vertical support unit 22 or otherwise supported by other structures. For example, in the embodiment shown, motherboard 62 is illustrated as generally extending in a horizontal plane. In alternative applications or embodiments, computer system 24 and motherboard 62 may alternatively extend within a generally vertical plane such as when chassis 52 is turned on its sides. Thus, floor 90 may alternatively be oriented as a side wall if computer system 24 was supported on its side at a 90 degree angle with respect to the orientation shown in FIG. 2.

FIG. 6 further illustrates the interface between motherboard support system 50 and chassis 52 in greater detail. For ease of illustration, only a single side of support 66 and chassis 52 is shown in FIG. 6. The other side of support 66 and chassis 52 not shown is substantially identical to that shown in FIG. 6. As shown by FIG. 6, support 66 and floor surface 90 are specifically configured to minimize frictional contact therebetween to facilitate sliding movement of support 66 and motherboard support system 50 relative to chassis 52. In the particular embodiment illustrated, support 66 includes opposite down-turned rails 92 which are configured to bear against surface 90 while supporting the remainder of support 66 above and out of frictional engagement with floor 90. In the particular embodiment illustrated, rails 92 are formed by inwardly bending opposite edges of support 66. In alternative embodiments, rails 92 may be formed by downwardly and outwardly bending opposite edge portions of support 66 or may be provided by permanently or releasably coupling other structures to support 66 along opposite edges of support 66 so as to support or elevate the remainder of support 66 above floor 90. Although rails 92 continuously extend along opposite sides of support 66, rails 92 may alternatively be intermittently spaced or positioned along opposite edges of support 66.

As further shown by FIG. 6, floor 90 includes a plurality of support bumps or plateaus 94. Plateaus 94 serve to strengthen or rigidify floor 90 of chassis 52 as well as to serve as secondary support surfaces for limiting deformation of support 66 during high loading conditions. Plateaus 94 prevent accidental damage to motherboard 62 during such high loading conditions. Although less desirable, plateaus 94 may be omitted.

As further shown by FIG. 6, computer system 24 additionally includes guides 95. Guides 95 generally comprise structures coupled to chassis 52 at least partially along opposite edges of chassis 52 on opposite sides of support 66. Guides 95 are generally configured to guide sliding movement of motherboard support system 50 within chassis 52. Although only one guide 95 is shown, system 24 includes two guides 95 on opposite edges of support 66. Each guide 95 generally includes guide surfaces 96 and 97. Guide surface 96 prevents undesirable movement of support 66 of motherboard support system 50 in the directions indicated by arrows 98. At the same time, guide surface 97 limits or prevents undesirable movement of motherboard support system 50 in the direction indicated by arrows 99. Guide surfaces 96 and 97 cooperate to limit or prevent support 66 from becoming jammed within chassis 52 and to further ensure proper alignment of connector 68 with connector 60. Although guide 95 is illustrated as a distinct component mounted to chassis 52, guide 95 may alternatively be integrally formed as part of a single unitary body with chassis 52, may be welded to chassis 52 or may be coupled to other support structures within chassis 52. Although less desirable, guide 95 may omit one of guide surfaces 96 or 97. In particular applications, guide 95 may be omitted where precise alignment of connectors 68 and 60 is otherwise provided for or wherein support 66 is guided within chassis 52 by other means such as by direct contact with chassis 52.

Guide surface 97 cooperates with floor 90 to form a channel for the reception of rail 92. In alternative embodiments, guide 95 may alternatively be configured to also provide a surface opposite surface 97 to form a channel for reception of rail 92. In still other embodiments, guide 95 may be configured to elevate or support support 66 above floor 90 in lieu of rails 92. For example, support 66 may be provided with opposite channels facing away from one another which receive a projection extending from guide 95. In still other embodiments, other means may be used to provide a slidable interface between motherboard support system 50 and chassis 52. For example, surfaces of low friction material, roller or ball bearings or other similar devices may be employed to facilitate sliding movement of motherboard support system 50 relative to chassis 52.

FIGS. 7–12 illustrate one particular embodiment of actuator 56 and its operation in detail. As best shown by FIG. 7, actuator 56 generally includes lever 100 and retainer 102. Lever 100 generally comprises an elongate member pivotally supported proximate to motherboard support system 50 when motherboard support system 50 is positioned within chassis 52. Lever 100 has a handle portion 104 and an engagement portion 106. Handle portion 104 is generally configured to be grasped by an individual's hand for pivotal movement of lever 100. Engagement portion 106 is generally configured to at least temporarily engage either motherboard 62 or a surface directly or indirectly coupled to motherboard 62. Lever 100 pivots about a pivot axis 108 proximate to engagement portion 106. Handle portion 104 is spaced a greater distance from pivot axis 108 as compared to engagement portion 106. As a result, lever 104 provides a mechanical advantage in that the force applied at handle portion 104 is enhanced or enlarged at engagement portion 106. In the particular embodiment illustrated, lever 100 provides an input to output force ratio of at least 10:1. This enhanced force created by pivoting of lever 100 about axis 108 while engagement portion 106 is in engagement with a surface directly or indirectly coupled to motherboard 62 facilitates connection and disconnection of connectors 68 and 60. In the particular embodiment illustrated, connectors 68 and 60 generally require anywhere from between about 75 pounds to 100 pounds of force to facilitate connection or disconnection. It has been found that most typical users object to any required manual connection force of greater than about 15 pounds. Lever 100 enables its users to apply a force to handle portion 104 of less than about 15 pounds while still achieving sufficient force to connect or disconnect connectors 68 and 60.

As best shown by FIG. 7, motherboard support system 50 additionally includes a catch member 112 coupled to motherboard 62 and providing a catch surface 114 which is engaged by engagement portion 106 of lever 100 during pivotal movement of lever 100. In the particular embodiment illustrated, catch 112 is mounted directly to motherboard 62. In alternative embodiments, catch 112 may be mounted directly to support 66 or other rigid structures extending from support 66. Although less desirable, catch 112 may be omitted, wherein engagement portion 106 of lever 100 engages other surfaces coupled to motherboard 62.

As further shown by FIG. 7, retainer 102 generally comprises a structure configured to retain lever 100 in position. Retainer 102 generally includes an outwardly sloped or tapered surface 120, a stop surface 122 and a retaining surface 124. Sloped surface 120 projects outwardly and terminates at retaining surface 124. Stop surface 122 is generally spaced from retaining surface 124 by a distance corresponding to the dimension of handle portion 104 of lever 100. As will be described in greater detail hereafter, retainer 102 retains lever 100 in a connecting state such that accidental or inadvertent rotation of lever 100 is prevented and such that inadvertent disconnection of connectors 60 and 68 is also prevented.

Figure 8:
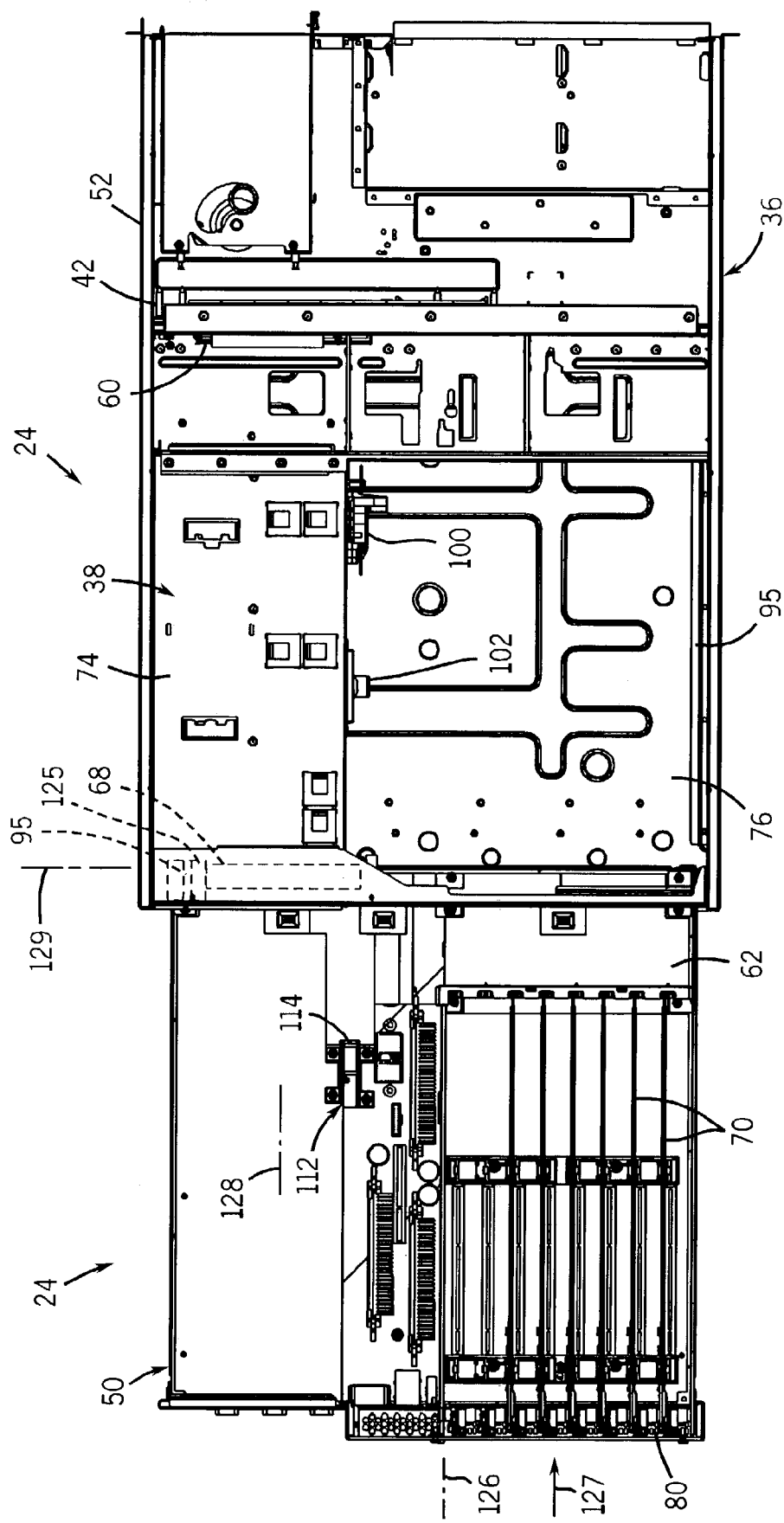
FIG. 8 is a top plan view of the computer system of FIG. 3.

FIG. 8 illustrates the location at which catch 112 is coupled to motherboard 62. As best shown by FIG. 8, connector 60 extends from vertical backplane 42 generally opposite housing 74 of power system 38. Connector 68 of motherboard support system 50 extends along a perimeter edge 125 of motherboard 62 such that sliding movement of motherboard support system 50 along axis 126 in the direction indicated by arrow 127 results in the connection of connectors 68 and 60. Catch 112 is coupled to motherboard 62 such that catch surface 114 is positioned as close as possible to center line 128 which passes through the centers of connectors 60 and 68. Catch surface 114 is also located as close as possible to center line 129 which passes through a center of connector 68. Lastly, catch surface 114 is located as close as possible to a general plane along which motherboard 62 extends. As a result, torsional forces upon motherboard 62 during the application of force to catch surface 114 by lever 100 are reduced to minimize the chance of potential damage to motherboard 62 or either connector 60 or 68. In the particular embodiment illustrated, location of catch 112 relative to center line 128 is limited by the extent of housing 74 of power system 38 and the location of lever 100, which must engage catch surface 114. The location of catch 112 relative to center line 129 is limited by the location of lever 100 as well as the extent to which motherboard support system 50 extends beneath fans 40 (shown in FIG. 1). In alternative embodiments, the location of catch 112 and its catch surface 114 may be improved depending upon the configuration and relative locations of power system 38, fans 40 and other components of computer system 24.

FIG. 8 further illustrates the relative locations of lever 100 and retainer 102. In the particular embodiment illustrated, lever 100 is pivotally mounted to a side of housing 74 of power system 38. Similarly, retainer 102 is coupled to and supported by housing 74 of power system 38. As a result, lever 100 and retainer 102 utilize existing internal structures for being supported proximate to the plane in which motherboard support system 50 slides. In alternative embodiments, one or both of lever 100 and retainer 102 may be supported by additional auxiliary support structures within chassis 52 or may be supported directly by chassis 52 depending upon size and location of connectors 68 and 60 and the desired location of catch surface 114 relative thereto while minimizing torsion upon the connectors 60, 68 and upon motherboard 62.

Figure 9:
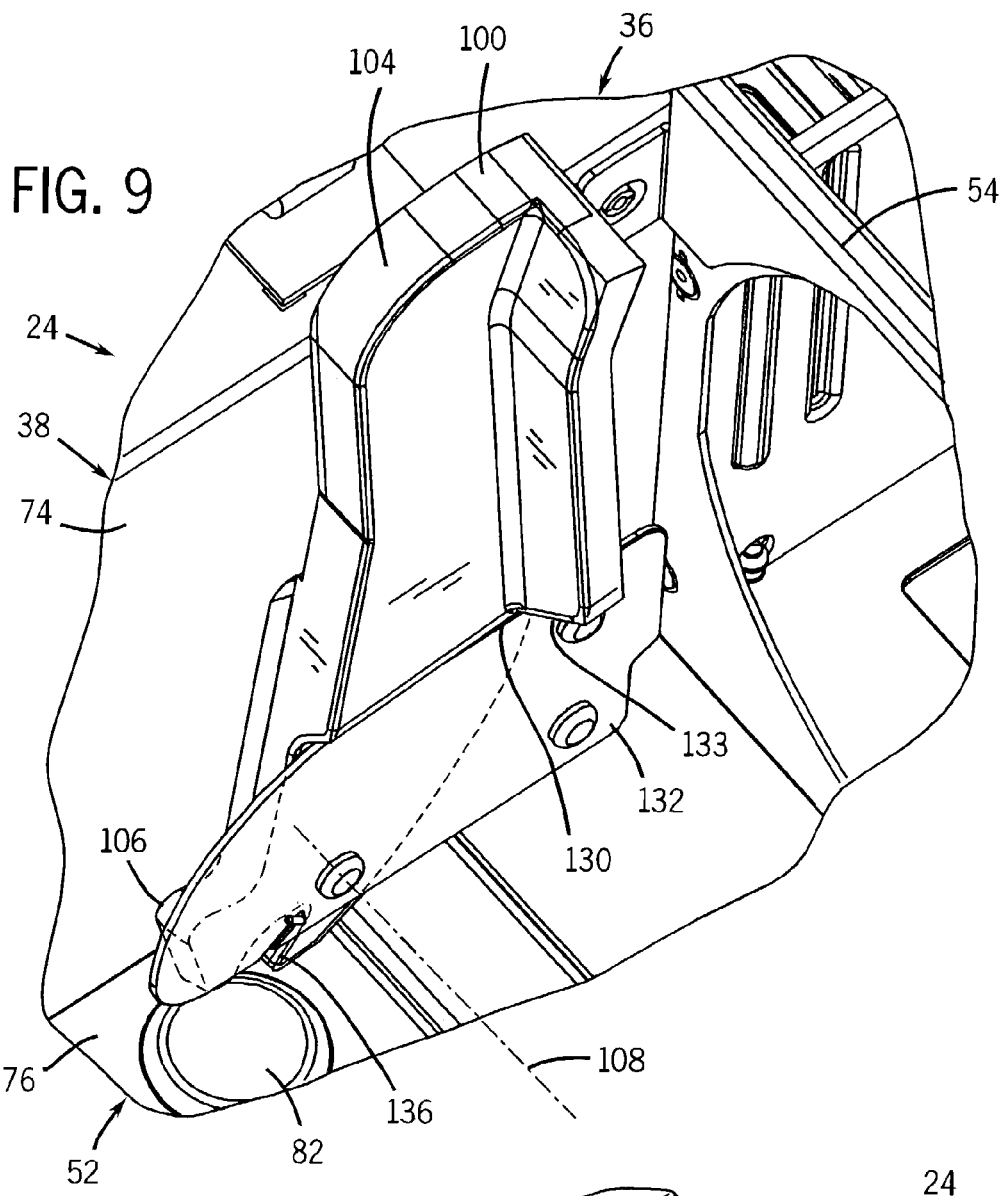
FIG. 9 is an enlarged fragmentary view of the computer system of FIG. 3 illustrating one embodiment of an actuator for moving the motherboard support system.
Figure 10:
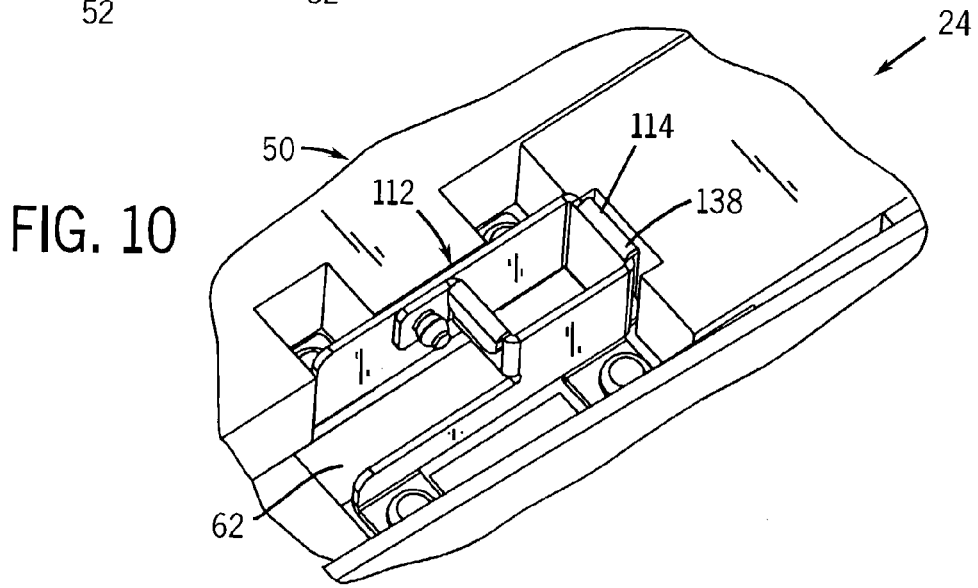
FIG. 10 is an enlarged fragmentary view of the computer system of FIG. 3 illustrating one embodiment of a catch surface coupled to a motherboard.

FIGS. 9 and 10 illustrate lever 100 and catch member 112 in greater detail. As best shown by FIG. 9, lever 100 pivots about axis 108 adjacent a stop surface 130 provided by member 132. Handle portion 104 of lever 100 includes shoulder surface 133. Lever 100 pivots about axis 108 between a raised or disconnecting state (shown in FIG. 9) during which connectors 68 and 60 are disconnected from one another and a lowered or connecting state during which connectors 68 and 60 are connected to one another. In the particular embodiment illustrated, lever 100 is resiliently biased towards the raised or disconnecting state by a torsion spring 135 (shown in FIG. 7) having one end coupled to housing 74 and having the other end coupled to lever 100. Torsion spring 135 ensures that lever 100 is in a "ready-to-accept" position during insertion of motherboard 62 into chassis 52 to prevent potential damage to catch 112 during such insertion of motherboard 62. Shoulder surface 133 is configured to abut stop surface 130 when lever 100 is in the disconnecting state. As a result, lever 100 cannot be over-rotated. In alternative embodiments, lever 100 is resiliently biased towards the raised or disconnecting state by other conventionally known or future developed spring means or is retained by gravity in the disconnecting state.

As further shown by FIG. 9, engagement portion 106 of lever 100 includes a detent or notch 136. Notch 136 is generally configured to receive catch surface 114 during rotation of lever 104 between the disconnecting state and the connecting state. As shown by FIG. 10, catch surface 114 is provided by an elongate bar 138 provided by catch member 112. In alternative embodiments, the configuration of notch 136 and catch surface 114 may be modified so long as there is inner engagement between catch member 112 and engagement portion 106 at least temporarily during rotation or pivotal movement of lever 100 about axis 108.

In the particular embodiment illustrated, engagement portion 106 is configured such that (1) rotation of lever 100 in a first direction about axis 108 urges motherboard support system 50 and connector 68 in a direction out of chassis 52 so as to facilitate disconnection of connectors 68 and 60 and (2) rotation of lever 100 in an opposite direction results in engagement portion 106 engaging catch surface 114 to urge motherboard support system 50 into chassis 52 and to urge connectors 68 and 60 into connection with one another. Although less desirable, lever 100 and catch surface 114 may alternatively be configured such that rotation of lever 100 either urges connectors 68 and 60 towards a connected state or urges connectors 68 and 60 towards a disconnected state. Although lever 100 is configured to enhance forces to facilitate connection and disconnection of connectors 68 and 60, lever 100 may alternatively be used in applications where connection of connectors 68 and 60 is not required. For example, lever 100 may alternatively be utilized to assist in removal or insertion of motherboard support system 50 into and out of chassis 52.

Figures 11, 12:
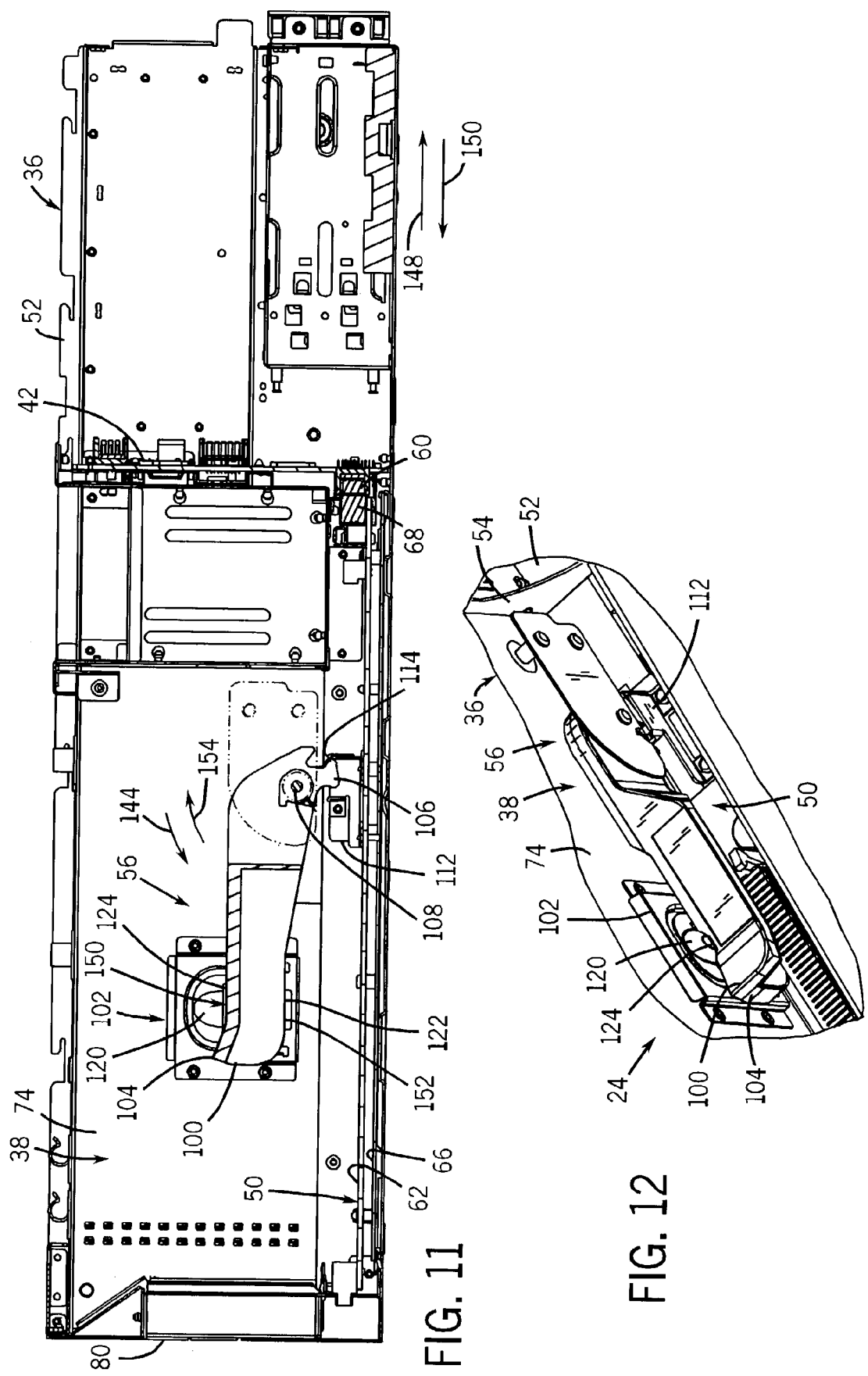
FIG. 11 is a sectional view of the computer system of FIG. 3 illustrating one embodiment of an actuator comprising a lever in a connecting state.
FIG. 12 is an enlarged fragmentary view of the computer system of FIG. 11 illustrating in greater detail the lever in the connecting state.

FIGS. 11 and 12 illustrate pivoting of lever 100 about pivot axis 108 in the direction indicated by arrow 144 from the disconnecting state (shown in FIGS. 7 and 9) to the connecting state (shown in FIGS. 11 and 12). As shown by FIG. 11, during pivotal movement of lever 100 in the direction indicated by arrow 144, catch surface 114 is engaged by engagement portion 106 of lever 100 to urge motherboard support system 50 and connector 68 in a direction indicated by arrow 148. The force is sufficient such that connector 68 moves into connection with connector 60 of vertical backplane 42.

As lever 100 is rotated in the direction indicated by arrow 144, handle portion 104 bears against sloped surface 120 and resiliently deflects surface 120 inward until surface 150 of lever 100 has moved past surface 120 and past retaining surface 124. Substantial continued rotation of lever 100 in the direction indicated by arrow 144 is prevented by stop surface 122 engaging surface 152 of lever 100. At the same time, surface 120 and retaining surface 122 resiliently return to their initial shape so as to capture lever 100 between stop surface 122 and retaining surface 124. Consequently, retainer 102 prevents inadvertent rotation of lever 100 while engagement portion 106 of lever 100 is in engagement with catch surface 114 to maintain connection of connectors 68 and 60.

To disconnect connectors 68 and 60 and to urge motherboard support system 50 in a direction out of chassis 52, lever 100 is simply lifted and rotated in a direction indicated by arrow 154. During such rotation, retaining surface 124 and sloped surface 120 resiliently deflect. As lever 100 is rotated in the direction indicated by arrow 154, engagement portion 106 engages an opposite portion of catch surface 114 to urge motherboard support system 50 in the direction indicated by arrow 158 until connectors 68 and 60 are disconnected. Rotation of lever 100 is generally terminated upon shoulder surface 133 abutting stop surface 130 (shown in FIG. 9).

Overall, computer system 24 provides a motherboard that can be easily accessed by sliding motherboard support system 50 at least partially out of chassis 52. Motherboard support system 50 and the corresponding structure of support 36 preserves valuable space within chassis 52. In addition, actuator 56 facilitates connection and disconnection of connectors 68 and 60 which join motherboard 62 to vertical backplane 42 while minimizing potential damage to such connectors caused by misalignment or torsion. The configuration of computer system 24 also facilitates access and repair of motherboard support system 50 even while chassis 52 remains supported by a rack or other vertical support unit.

Although computer system 24 is illustrated as incorporating multiple beneficial features utilized in conjunction with one another, such individual features may alternatively be used independent of one another in alternative applications. For example, chassis 52 may be configured to slidably support motherboard support system 50 between chassis 52 and one or more internal components of system 24, such as power system 38 or fans 40, in applications where motherboard 62 is not connected to a vertical backplane. Actuator 56 may be provided to urge a sliding motherboard 62 so as to connect the motherboard to a vertical backplane or an auxiliary backplane that extends parallel to motherboard 62. Actuator 56 may also be utilized to urge a sliding motherboard in applications where the motherboard does not extend between chassis 52 and an internal component of system 24. These and various other modifications are contemplated in the present disclosure.

Although the present invention has been described with reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Because the technology of the present invention is relatively complex, not all changes in the technology are foreseeable. The present invention described with reference to the preferred embodiments and set forth in the following claims is manifestly intended to be as broad as possible. For example, unless specifically otherwise noted, the claims reciting a single particular element also encompass a plurality of such particular elements.

What is claimed is:

1. A multi-computer support system comprising:
a vertical support unit configured to support a plurality of computer systems; and
a computer system supported by the vertical support unit, the computer system including:
a chassis;
an electronic component mounted to the chassis;
at least one daughter card; and
a motherboard support system including a first printed circuit board supporting the at least one daughter card and slidably supported between the chassis and the component, wherein the motherboard support system is slidable between a first position in which the motherboard support system is substantially received within the chassis and a second position in which the motherboard support system is at least partially removed from the chassis; and
a lever pivotally supported proximate the motherboard support system for rotation about an axis that remains stationary relative to the chassis during movement of the motherboard support system between the first position and the second position, wherein the lever at least temporarily engages the motherboard support system and wherein rotation of the lever in at least one direction transmits force to the motherboard support system to urge the motherboard support system towards at least one of the first position and the second position.

2. The system of claim 1 including at least one guide slidably engaging the motherboard support system during movement between the first position and the second position.

3. The system of claim 2, wherein the at least one guide includes:
a first surface proximate the first edge of the motherboard support system; and
a second surface opposite the first surface proximate a second opposite edge of the motherboard support system.

4. The system of claim 3, wherein the first surface and the second surface extend in a horizontal plane.

5. The system of claim 3, wherein the first surface and the second surface are located in a common horizontal plane.

6. The system of claim 3, wherein the first surface and The second surface extend above a portion of the motherboard support System.

7. The system of claim 1, wherein the component comprises a power system directly mounted to the chassis and wherein the motherboard support system slides in a plane to the first position in which the first printed circuit board is located between the power system and the chassis.

8. The system of claim 1, wherein the component comprises a fan directly mounted to the chassis and wherein the motherboard support system slides in a plane to the first position in which the first printed circuit board is located between the fan and the chassis.

9. The system of claim 1 wherein rotation of the lever in a first direction applies a force to the motherboard support system to urge the motherboard support system towards the second position.

10. The system of claim 9, wherein the lever is configured such that rotation of the lever in a second direction applies a force to the motherboard support system to urge the motherboard support system towards the first position.

11. The system of claim 1 including at least one support structure rigidly coupled to the chassis within the chassis, wherein the lever is pivotally coupled to the support structure within the chassis.

12. The system of claim 1 wherein rotation of the lever applies a force to the motherboard support system to urge the motherboard support system towards the first position.

13. The system of claim 1, wherein the lever rotates about a horizontal axis.

14. The system of claim 1, wherein the lever has an input to output force ratio of at least about 10 to 1.

15. The system of claim 1, wherein the motherboard support system includes a catch surface extending from a face of the first printed circuit board and wherein the lever engages the catch surface.

16. The system of claim 1 is a computer system of claim 1, wherein the motherboard support system includes a support coupled to the first printed circuit board.

17. The computer system of claim 16, wherein the support extends beyond opposite edges of the first printed circuit board.

18. The computer system of claim 17, wherein portions of the support extend across the first printed circuit board.

19. The system of claim 18, wherein the support continuously extends along a face of the printed circuit board.

20. The system of claim 19 including at least one stand off between the support and the printed circuit board.

21. The system of claim 1 including a second printed circuit board coupled to the chassis and including at least one first connector, wherein the motherboard support system includes at least one second connector coupled to the first printed circuit board and wherein the at least one first connector and the at least one second connector are interconnected to one another as a result of movement of the motherboard support system towards the first position.

22. The system of claim 21, wherein the motherboard support system generally extends in a first plane and wherein the second printed circuit board generally extends in a second plane perpendicular to the first plane.

23. The system of claim 22, wherein the at least one first connector and the at least one second connector interconnect with one another along a plane coextensive with or parallel to the second piano of the motherboard support system.

24. A method for assembling and disassembling a computer system including a chassis, a first printed circuit board having at least one first connector and supporting at least one second printed circuit board connected to the first printed circuit board, and a third printed circuit board within the chassis having at least one second connector and configured to electrically connect the first tinted circuit board to an auxiliary component supported by the chassis, the method comprising:
  sliding the first printed circuit board relative to the chassis between a first position in which the at least one first connector engages the at least one second connector and a second position in which the first printed circuit board is at least partially removed from the chassis while the auxiliary component remains stationary relative to the chassis, while the chassis is supported by a vertical support system and while the first printed circuit board is supported by the chassis.

25. The method of claim 24, wherein the computer system includes a power system directly mounted to the chassis and wherein the step of sliding includes sliding the first printed circuit board within a plane between the power system and the chassis.

26. The system method of claim 24, wherein the computer system includes a fan directly mounted to the chassis and wherein the step of sliding includes sliding the first printed circuit board within a plane between the fan and the chassis.

27. The system method of claim 24, wherein the step of sliding includes rotating a lever in engagement with a motherboard support system to slide the motherboard support system towards the first position.

28. The method of claim 24, wherein the auxiliary component is on a first side of the third printed circuit board and wherein the at least one second connector is on a second side of the third printed circuit board.

29. A method for servicing a motherboard of a computer system having a chassis to which an electronic component is directly mounted while the chassis is supported by a rack, the method comprising:
  rotating a lever pivotally supported adjacent to the motherboard, wherein rotation of the lever causes the lever to engage at least one surface coupled to the motherboard to apply a force to the motherboard to slide the motherboard in a single plane relative to the component and at least partially out of the chassis while the chassis remains attached to the rack.

30. The method of claim 29 including sliding the motherboard completely out of the rack.

31. The method of claim 29 including the step of disconnecting any cables connected to the motherboard.

32. The method of claim 29, wherein the chassis is coupled to a slide supported by the rack and wherein the method further includes the steps of moving the chassis in a first direction relative to the rack using the slide and sliding the motherboard relative to the chassis in a second opposite direction to at least partially remove the motherboard from the chassis.

33. A support system for a computer system having a motherboard having at least one slot configured to receive at least one printed circuit board, the support system including:
  a chassis; and
  an actuator coupled to the chassis and configured to engage the motherboard to move the motherboard towards at least one of a first position in which the motherboard is completely received within the chassis and a second position in which the motherboard is at least partially removed from the chassis.

34. The system of claim 33, wherein the actuator includes a lever pivotably coupled to the chassis, wherein the lever is configured to pivot while in engagement with the motherboard to move the motherboard relative to the chassis.

35. The system of claim 33 including at least one guide surface coupled to the chassis and configured to guide sliding movement of the motherboard relative to the chassis.

36. The system of claim 35, wherein the at least one guide includes:
  a first surface proximate a first edge of the motherboard; and
  a second surface proximate a second opposite edge of the motherboard.

37. The system of claim 35, wherein the at least one surface extends in a horizontal plane.

38. The system of claim 35, wherein the at least one surface includes a first surface and a second surface and wherein the first surface and the second surface are located in a common horizontal plane.

39. The system of claim 35, wherein the chassis and the at least one surface form a channel for guiding movement of the motherboard.

40. A motherboard support system for use with a computer system including a support system having a chassis, and a lever pivotally supported by the chassis, the mother system support system including:
  at least one daughter card;
  a motherboard supporting the at least one daughter card; and
  a catch surface coupled to the motherboard, wherein the catch surface is adapted to engage the lever during rotation of the lever such that the motherboard is urged towards at least one of a first position in which the motherboard is completely received within the chassis and a second position in which the motherboard is at least partially removed from the chassis.

41. The system of claim 40, wherein the catch surface extends from a face of the motherboard.

42. The system of claim 41, wherein the motherboard includes a printed circuit board and a connector extending beyond a perimeter of the printed circuit board.

43. A computer system comprising:
a chassis;
a motherboard support system including a first printed circuit board having a first connector;
a second printed circuit board having a second connector, wherein the motherboard support system is slidably supported by the chassis for movement between a first position in which the first connector is connected to the second connector and a second position in which the first connector and the second connector are disconnected; and
an actuator proximate the motherboard support system and configured to move the motherboard support system between the first position and the second position, wherein the actuator includes a lever pivotally coupled to the chassis for rotation about an axis that remains stationary relative to the chassis during movement of the motherboard support system between the first position and the second position, wherein the lever at least temporarily engages the motherboard support system and wherein rotation of the lever in a first direction applies a force to the motherboard support system to urge the motherboard support system towards one of the first position and the second position.

44. The system of claim 43, wherein the motherboard support system includes a support coupled to the first printed circuit board, wherein the support is slidably supported by the chassis.

45. The system of claim 43 including a component directly mounted to the chassis, wherein a motherboard support system is slidably supported for movement in a plane between the component and the chassis.

46. The system of claim 43 including a daughter card connected to and supported by the first printed circuit board.

47. A computer system comprising:
a chassis;
a motherboard having a first connector and at least one slot adapted to facilitate connection of a daughter card;
a printed circuit assembly within the chassis having a second connector;
means for slidably supporting the motherboard within the chassis for movement in a single plane between a first position in which the first connector and the second connector are connected and a second position in which the first connector and the second connector are disconnected and the motherboard is at least partially removed from the chassis; and
means pivotally attached to the chassis for rotation about an axis that remains stationary relative to the chassis during movement of the motherboard between the first position and the second position for urging the motherboard towards at least one of the first position and the second position.

48. The system of claim 47 including means for urging the motherboard towards at least one of the first position and the second position.

49. The system of claim 47 including means for selectively urging the motherboard towards the first position and the second position.

50. The system of claim 47 including a component coupled to the chassis, wherein the means for slidably supporting the motherboard slidably supports the first printed circuit assembly for movement in a plane between the chassis and the component.

51. A multi-computer support system comprising:
a vertical support unit configured to support a plurality of computer systems; and
a computer system supported by the vertical support unit, the computer system including:
a chassis;
an electronic component directly mounted to the chassis;
at least one daughter card; and
a motherboard support system including a first printed circuit board supporting the at least one daughter card and slidably supported between the chassis and the component, wherein the motherboard support system is slidable in substantially a single plane between a first position in which the motherboard support system is substantially received within the chassis and a second position in which the motherboard support system is at least partially removed from the chassis, wherein the component comprises a power system and wherein the motherboard support system slides in a plane located between the power system and the chassis.

52. A computer system comprising:
a chassis;
a component mounted to the chassis;
at least one daughter card;
an auxiliary electronic component;
a motherboard support system including a first printed circuit board supporting the at least one daughter card and slidably supported between the chassis and the component, wherein the motherboard support system is slidable in substantially a single plane between a first position in which the motherboard support system is substantially received within the chassis and a second position In which the motherboard support system is at least partially removed from the chassis;
a second printed circuit board coupled to the chassis and connected to the auxiliary electronic component, wherein the auxiliary electronic component is on a first side of the second printed circuit board and wherein the second printed circuit board includes at least one first connector extending from a second opposite side of the second printed circuit board, wherein the motherboard support system includes at least one second connector coupled to the first printed circuit board and wherein the at least one first connector and the at least one second connector are interconnected to one another as a result of movement of the motherboard support system towards the first position.

53. A method for assembling and disassembling a computer system including a chassis, a first printed circuit board having at least one first connector and supporting at least one second printed circuit board connected to the first printed circuit board, and a third printed circuit board having at least one second connector, the method comprising:
sliding the first printed circuit board in a single plane relative to the chassis between a first position in which the at least one first connector engages the at least one second connector and a second position in which the first printed circuit board is at least partially removed from the chassis while the chassis is supported by a vertical support system, wherein the step of sliding includes rotating a lever and about an axis that remains stationary relative to the chassis during movement of the first printed circuit board between the first position and the second position in engagement with the motherboard support system to slide the motherboard support system towards the second position.

54. A computer system comprising:
a chassis;
a component directly mounted to the chassis;
at least one daughter card;
a motherboard support system including a first printed circuit board supporting the at least one daughter card and slidably supported between the chassis and the component, wherein the motherboard support system is slidable between a first position in which the motherboard support system is substantially received within the chassis and a second position in which the motherboard support system is at least partially removed from the chassis; and
a lever pivotally coupled to the chassis, wherein the lever at least temporarily engages the motherboard support system and wherein rotation of the lever in a first direction applies a force to the motherboard support system to urge the motherboard support system towards one of the first position and the second position.

55. A computer system comprising:
a chassis;
a component mounted to the chassis;
at least one daughter card;
a motherboard support system including a first printed circuit board supporting the at least one daughter card and slidably supported between the chassis and the component, wherein the motherboard support system is slidable between a first position in which the motherboard support system is substantially received within the chassis and a second position in which the motherboard support system is at least partially removed from the chassis;
a lever pivotally supported proximate the motherboard support system, wherein the lever at least temporarily engages the motherboard support system and wherein rotation of the lever in at least one direction transmits force to the motherboard support system to urge the motherboard support system towards at least one of the first position and the second position; and
a catch surface extending from a face of the first printed circuit board, wherein the lever engages the catch surface.

* * * * *

UNITED STATES PATENT AND TRADEMARK OFFICE
CERTIFICATE OF CORRECTION

PATENT NO. : 7,068,498 B2  Page 1 of 1
APPLICATION NO. : 10/442036
DATED : June 27, 2006
INVENTOR(S) : Bryan D. Bolich et al.

It is certified that error appears in the above-identified patent and that said Letters Patent is hereby corrected as shown below:

IN THE SPECIFICATION

Column 4, line 45, after "and" and before "preferably" delete "-"

IN THE CLAIMS

Claim 6, Column 12, line 28, delete "The" and insert therefor --the--

Claim 23, Column 13, line 25, delete "piano" and insert therefor --plane--

Claim 26, Column 13, line 49, after "The" delete "system"

Claim 27, Column 13, line 53, after "The" delete "system"

Claim 52, Column 16, line 34, delete "In" and insert therefor --in--

Signed and Sealed this

Sixteenth Day of October, 2007

JON W. DUDAS
*Director of the United States Patent and Trademark Office*